(12) United States Patent
Du

(10) Patent No.: US 9,082,665 B2
(45) Date of Patent: Jul. 14, 2015

(54) FANOUT LINE STRUCTURE OF ARRAY SUBSTRATE AND DISPLAY PANEL

(71) Applicant: SHENZHEN CHINA STAR OPTOELECTRONICS TECHNOLOGY CO., LTD, Shenzhen (CN)

(72) Inventor: Peng Du, Shenzhen (CN)

( * ) Notice: Subject to any disclaimer, the term of this patent is extended or adjusted under 35 U.S.C. 154(b) by 74 days.

(21) Appl. No.: 14/008,539

(22) PCT Filed: Jun. 28, 2013

(86) PCT No.: PCT/CN2013/078292
§ 371 (c)(1),
(2) Date: Sep. 28, 2013

(87) PCT Pub. No.: WO2014/183327
PCT Pub. Date: Nov. 20, 2014

(65) Prior Publication Data
US 2014/0332898 A1  Nov. 13, 2014

(30) Foreign Application Priority Data
May 13, 2013  (CN) .......................... 2013 1 0173613

(51) Int. Cl.
*H01L 27/12* (2006.01)
*G02F 1/1345* (2006.01)

(52) U.S. Cl.
CPC .......... *H01L 27/124* (2013.01); *G02F 1/13452* (2013.01)

(58) Field of Classification Search
CPC . G02F 1/136286; H01L 27/124; H01L 24/20; H05K 1/0296; H05K 2201/09218
See application file for complete search history.

(56) References Cited

U.S. PATENT DOCUMENTS

2007/0285370 A1* 12/2007 Kim ................................ 345/92
2012/0306826 A1  12/2012 Tsuchi

FOREIGN PATENT DOCUMENTS

| CN | 101086995 A | 12/2007 |
| CN | 101728344 A | 6/2010 |
| CN | 201590281 U | 9/2010 |
| JP | 2012-252216 A | 12/2012 |
| KR | 10-2004-0107744 A | 12/2004 |

OTHER PUBLICATIONS

Fang Diyi, the International Searching Authority written comments, Feb. 2014, CN.

* cited by examiner

Primary Examiner — Whitney T Moore

(57) ABSTRACT

A fanout line structure of an array substrate includes a plurality of fanout lines arranged on a fanout area of the array substrate, where resistance value of the fanout line is dependent on length of the fanout line. Each of the fanout lines comprises a first conducting film. Resistance values of a first part of fanout lines are less than resistance values of a second part of the fanout lines, and the first part of fanout lines are covered by an additional conducting film. In the fanout lines covered by the additional conducting film, as the resistance value of the fanout line, increases, area of the additional conducting film covering the fanout line correspondingly decreases. An additional capacitor is generated between the additional conducting film and the first conducting film.

15 Claims, 5 Drawing Sheets

FANOUT LINE STRUCTURE OF ARRAY SUBSTRATE AND DISPLAY PANEL

TECHNICAL FIELD

The present disclosure relates to the field of a display device, and more particularly to a fanout line structure of an array substrate and a display panel.

BACKGROUND

A display panel generally includes a liquid crystal (LC) panel and an organic light emitting diode (OLED) panel. A driving circuit cooperating with a backlight unit drives the LC panel to display image.

As shown in FIG. 1, a thin film transistor (TFT) array area 120 is arranged on an array substrate 100 of the LC panel, where signal lines and TFTs are arranged in the TFT array area 120. Bonding pad of a driving circuit board 130 is connected with the signal line of the array substrate through fanout lines 111, and the fanout lines are arranged on a fanout area.

The bonding pad is closely arranged on the driving circuit board 130, but the signal lines are dispersedly arranged in the TFT array area 120, namely distances between the bonding pad and different signal lines are different, which allows the fanout lines, connected between the bonding pad and the signal lines, to have different resistance values. A waveform of a signal changes because of different lengths and resistance values of the fanout lines, thereby affecting display quality of the LCD device. At present, a coiling is arranged in the fanout line to allow different lengths and resistance values of fanout lines to obtain even resistance values. As shown in FIG. 2, a bending section 112 is formed in the fanout line through the coiling, which increases length of the fanout line, and then increases the resistance value of the fanout line, thereby synchronizing the signals transferred by the fanout lines. The bending section 112 increases a height H of the fanout area, as a straight-line distance between two endpoints of the fanout line shortens, a length of a coiling arranged in the fanout line correspondingly becomes long. However, a gap space between the fanout lines is limited, thus, as the straight-line distance between two endpoints of the fanout line shortens, more bending sections are arranged to increase the length of the coiling of the fanout line (two bending sections are arranged in each of the fanout lines in FIG. 2), which increases the height H of the fanout area, thereby affecting a flame width of the LCD device, and further affecting design of narrow frame of the LCD device. Additionally, signal waveform distortion occurs not only in an impact of the resistance value of the fanout line, but parasitic capacitance is also an important impact factor. The FIG. 3 is a cross-section diagram of the fanout area of the LC panel, where a parasitic capacitor $C_{LC}$ is generated between a first conducting film 106 of the fanout line 111 of the array substrate 100 and an indium tin oxide (ITO) conducting film 201 of a color filter substrate 200, and between a second conducting film 104 of the fanout line 111 of the array substrate 100 and the ITO conducting film 201 of the color filter substrate 200, which causes the signal to delay. However, because lengths of the fanout lines are different, an overlapping area between the first conducting film and the ITO conducting film and an overlapping area between the second conducting film and the ITO conducting film, which correspond to different lengths of fanout lines, are correspondingly different. Thus, the parasitic capacitors are different, which causes different influences for the signal.

SUMMARY

In view of the above-described problems, the aim of the present disclosure is to provide a display panel having a small height in a fanout area and a fanout line of an array substrate having a small height capable of obtaining good display quality and a narrow frame of a display device.

The purpose of the present disclosure is achieved by the following methods:

A fanout line structure of an array substrate comprises a plurality of fanout lines arranged on a fanout area of the array substrate, where resistance value of the fanout line is dependent on length of the fanout line. Each of the fanout lines comprises a first conducting film. Resistance values of a first part of fanout lines are less than resistance values of a second part of the fanout lines, and the first part of the fanout lines are covered by an additional conducting film. In the fanout lines covered by the additional conducting film, as the resistance value of the fanout line increases, area of the additional conducting film covering the fanout line correspondingly decreases. An additional capacitor is generated between the additional conducting film and the first conducting film.

Furthermore, a width of the additional conducting film of each of the fanout lines is a same as a width of an overlapping area between the first conducting film and the additional conducting film of each of the fanout lines, and lengths of the additional conducting films that cover the fanout lines having different resistance values are different. Because the width of the additional conducting film of each of the fanout lines is the a same as the width of the overlapping area between the first conducting film and the additional conducting film of each of the fanout lines, a length of the additional conducting film of each of the fanout lines is obtained according to a length of the fanout line, and a corresponding area of the additional conducting film covering the fanout line is further obtained, thereby obtaining a corresponding additional capacitor.

Furthermore, length of the additional conducting film that covers on the fanout line is $L_{22}$: $L_{22} = \in_{r1} d_2 (L_1^2 - L_2^2)/L_2 (d_1 \in_{r2} - d_2 \in_{r1})$, where $L_1$ is a length of one of the plurality of fanout lines, and a fanout line having a length L1 is regarded as a reference line. $L_2$ is a length of the fanout line covered by the additional conducting film, $L_{22}$ is the length of the additional. conducting film covering the fanout lines of having a length $L_2$, $\in_{r1}$ is a relative dielectric constant of a liquid crystal layer of a liquid crystal panel, $d_1$ is a thickness of the liquid crystal layer, $\in_{r2}$ is a relative dielectric constant of a dielectric medium between the additional conducting film and the first conducting film, and $d_2$ is a thickness of an insulating layer between the additional conducting film and the first conducting turn.

Furthermore, the reference line is a longest fanout line of all of the fanout lines. The longest fanout line does not need be covered by the additional conducting film because the resistance value of the longest fanout line itself is greatest in all of the fanout lines, thus, area of the additional conducting film of the fanout line is calculated according to the reference line (namely the longest fanout line).

Furthermore, a dielectric medium between the additional conducting film and the first conducting film is a passivation layer, where the passivation layer has good insulating effect.

Furthermore, straight-line distances between two endpoints of some of the fanout lines are different, in the fanout lines having a short straight-line distance, at least one fanout line is configured with a bending section. A waveform of the signal is affected by resistance value R and the parasitic capacitor C of the fanout line, and a formula of the time constant τ of signal delay of the fanout line is: τ=RC. Namely, if the time constant τ of signal delay of each of the fanout line is needed to be same, the resistance value R and the parasitic capacitor C of the fanout line can be simultaneously adjusted, which may meet requirement of the process, design, and production.

Furthermore, the first conducting film is a metal conducting film, Where the metal conducting film has good conducting effect, which reduces signal delay.

Furthermore, the additional conducting film is an indium tin oxide conducting film, which is directly added in a process of manufacturing the array substrate without any other process.

Furthermore, the fanout line further comprises a second conducting film arranged under the first conducting film. Stability of the fanout line having two conducting films is good.

A display panel comprises any one of the above-mentioned fanout lines.

In the present disclosure, resistance values of the first part of fanout lines of the array substrate are less than resistance values of the second part of the fanout lines of the array substrate, and the first part of the fanout lines are covered by an additional conducting film. In the fanout lines covered by the additional conducting film, as the resistance value of the fanout line increases, area of the additional conducting film covering the fanout line correspondingly decreases. An additional capacitor is generated between the additional conducting film and the first conducting film. A resistor-capacitor (RC) delay is caused by the parasitic capacitor to a signal transferred by the fanout line. Thus, the fanout line having a relatively small resistance value may delay transferring the signal through the additional capacitor, which allows the signal transferred by the fanout line having the small resistance value to synchronize with the signal transferred by the fanout line having a great resistance value, where the fanout line having the great resistance value itself has longer delay time than the fanout line having the small resistance value.

DETAILED DESCRIPTION

The present disclosure will further be described in detail in accordance with the figures and the exemplary examples.

EXAMPLE 1

Figure 1:
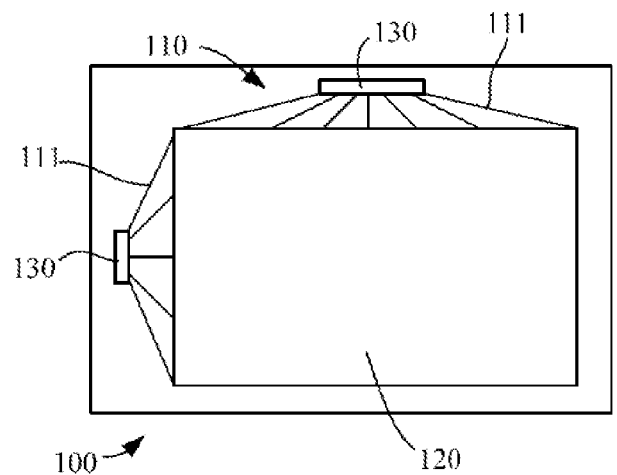
FIG. 1 is a structural diagram of an array substrate of a typical liquid crystal (LC) panel.
Figure 2:
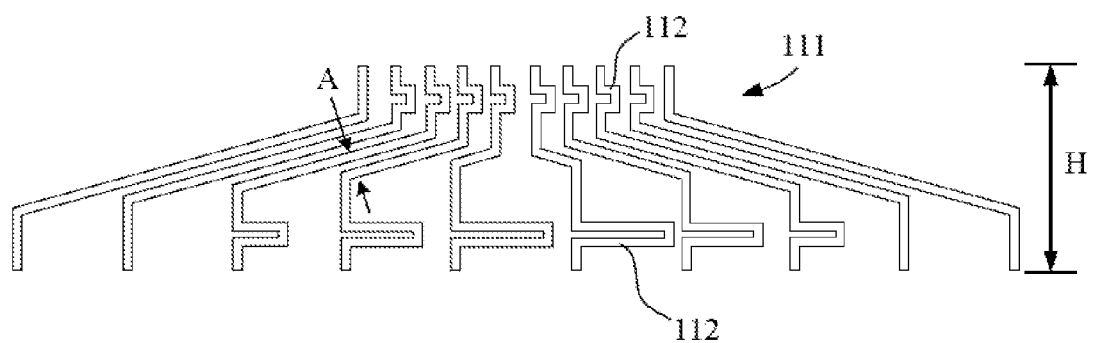
FIG. 2 is a structural diagram of a fanout line in a fanout area of an array substrate of a typical LC panel.
Figure 4:
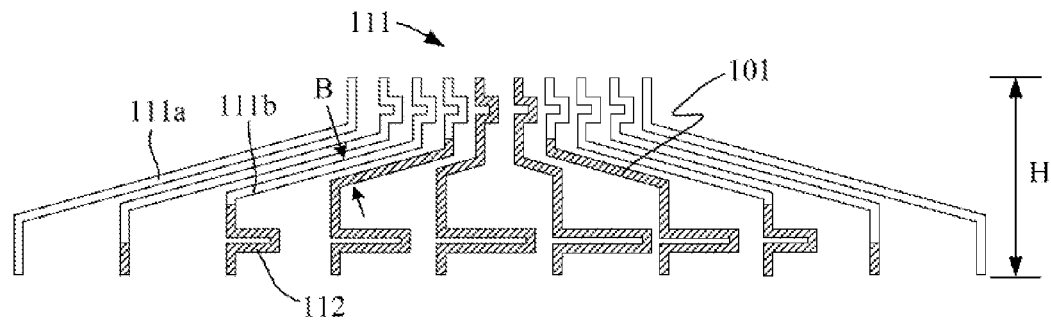
FIG. 4 is a schematic diagram of a fanout line of an LC panel of a first example of the present disclosure.
Figure 5:
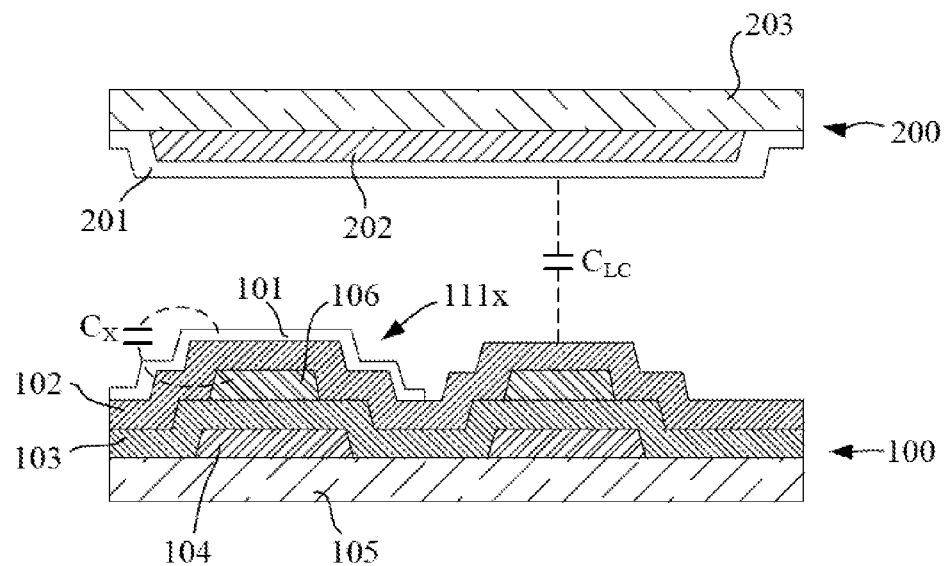
FIG. 5 is a cross sectional view of a fanout line along B direction as shown in FIG. 4.

As shown in FIG. 4 and FIG. 5, and in reference to FIG. 1, a first example provides a liquid crystal (LC) panel comprising an array substrate 100 and a color filter substrate 200, where the color filter substrate 200 comprises a first glass substrate 203, a black matrix 202, and an indium tin oxide (ITO) conducting film 201. An area comprising a plurality of fanout lines of the array substrate 100 is regarded as a fanout area 110 (as shown in FIG. 1), and the plurality of fanout lines 111 are arranged on a second glass substrate 105, where lengths of the plurality of fanout lines are different, and resistance values of the plurality of fanout lines are correspondingly different. Each of the fanout lines 111 at least comprises a first conducting film 106. In all of the fanout lines 111, resistance values of a first part of fanout lines are less than resistance values of a second part of fanout lines, the first part of fanout lines having a relatively small resistance value are labeled as 111x, the fanout lines 111x are covered by an additional conducting film 101 (as shown in FIG. 5). In the fanout lines 111x, a first insulating layer 102 (passivation layer, PAV) is a dielectric medium, and is arranged between the additional conducting film 101 and the first conducting film 106. As the resistance value of the fanout line 111x increases, area of the additional conducting film covering the fanout line 111x correspondingly decreases (as shown in FIG. 4). The additional conducting film 101 is able to be connected with a common electrode, a ground terminal, and other electrode. An additional capacitor Cx is generated between the additional conducting film 101 and the first conducting film 106, and the additional capacitor Cx is used to reduce impedance difference between the fanout lines.

The additional capacitor Cx is a parasitic capacitor. A resistor-capacitor (RC) delay is caused by the parasitic capacitor to a signal transferred by the fanout line 111. Thus, the fanout line having a relatively small resistance value may delay transferring the signal through the additional capacitor Cx, which allows the signal transferred by the fanout line having the small resistance value to synchronize with the signal transferred by the fanout line having a great resistance value, where the fanout line having the great resistance value itself has a longer delay time than the fanout line having the small resistance value. A formula for calculating a time constant τ of signal delay of the fanout line is: τ=RC, where R is the resistance value of the fanout line, and C is the capacitance value of the fanout line. Namely, the signal delay time of the fanout line depends on the resistance value of the fanout line and the capacitance value of the fanout line.

An optimized structure of the first example as follows: the first insulating layer 102 employs the passivation layer (PAV) haying good insulating effect, the first conducting film 106 is a metal conducting film having good conducting effect and small signal delay. The additional conducting film 101 is the indium tin oxide film (ITO), which is directly added in a process of manufacturing the array substrate.

The fanout lines 111 further comprises a second conducting film 104 arranged under the first conducting film 106, and the second conducting film 104 is the metal conducting film. A second insulating layer 103 (gate insulating layer, GI) is arranged between the first conducting film 106 and the second conducting film 104. The fanout line has two conducting films, which improves stability of the fanout line. It should be understood that the fanout line may be configured with three conducting films or more conducting films. The fanout line successively comprises the second conducting film 104 arranged on a bottom layer of the array substrate, the second insulating layer 103 arranged on the second conducting film 104, the first conducting film 106 arranged on the second insulating layer 103, and the first insulating layer 102 arranged on the first conducting film 106. The first insulating layer 102 of some of the fanout lines 111 are covered by the additional conducting film 101. As the resistance value of the fanout line increases, area of the additional conducting film covering the fanout line 111*x* correspondingly decreases, where the length of the fanout line and the resistance value of the fanout line are directly proportional.

Figure 3:
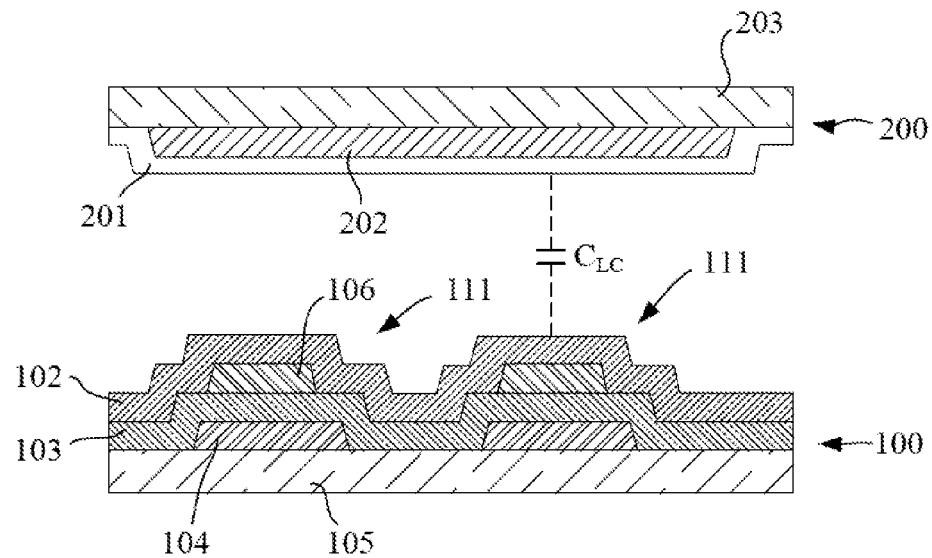
FIG. 3 is a cross sectional view of a fanout line along A direction as shown in FIG. 2.

The length of each of the fanout lines is different, thus, the resistance value of the each of the fanout lines is correspondingly different. In order to synchronize the signal, the additional capacitor Cx of each of the fanout lines is also different. The additional capacitor Cx of each of the fanout lines is relative to an overlapping area between the additional conducting film 101 and the first conducting film 106. As shown in FIG. 3 and FIG. 5, the parasitic capacitor $C_{LC}$ is generated between the fanout line without the additional conducting film 101 and the ITO conducting film 201 of the color filter substrate 200, and the parasitic capacitor $C_{LC}$ is generated by the first conducting film 106 of the fanout line 111, the second conducting film 104 of the fanout line 111, and the ITO conducting film 201 of the color filter substrate 200. Capacitance value of the parasitic capacitor $C_{LC}$ is far less than capacitance value of the additional capacitor $C_X$ because of a great thickness of a liquid crystal layer, thus, the parasitic capacitor $C_{LC}$ causes small RC delay. However, in order to improve accuracy of delay calculation, the parasitic capacitor should be considered. A formula for calculating the parasitic capacitor between the fanout line 111 and the ITO conducting film 201 of the color filter substrate 200 is:

$$C = \frac{\varepsilon_0 \cdot \varepsilon_r \cdot S}{d} = \frac{\varepsilon_0 \cdot \varepsilon_r \cdot L \cdot W}{d}$$

Where $\varepsilon_0$ is an absolute dielectric constant, $\varepsilon_r$ is a relative dielectric constant of the liquid crystal layer, L is the length of the fanout line. W is a width of the fanout line, and d is the thickness of the liquid crystal layer, where d is generally in a range of 3-4 μm.

The present disclosure will further be described in detail in accordance with calculating the area of the additional conducting film that covers the fanout line.

In order to simplify calculations, the width of the additional conducting film of each of the fanout lines 111 is a same as a width of the overlapping area (effective area of generating the capacitor) between the first conducting film 106 and the additional conducting film of each of the fanout lines 111. Lengths of the additional conducting films covering the fanout lines having different resistance values are different. If length of the fanout line is short, the fanout line needs to be covered by a long additional conducting film. In the first example, the width of the additional conducting film is the same as the width of the fanout line, thus, the width of the additional conducting film is the same as the width of the overlapping area between the first conducting film 106 and the additional conducting film, which simplifies manufacturing process and operation.

In order to determine an overlay length of the additional capacitor of the fanout line, one fanout line is chosen from all of the fanout lines as a reference line. As shown in FIG. 4, the first example chooses a longest fanout line 111*a* from all of the fanout lines as the reference line. The additional capacitor of the fanout line 111*b* covered by the additional conducting film is calculated by choosing the longest fanout line 111*a* as the reference line, namely the length of the additional conducting film that covers on the fanout line 111*b* is calculated. If a resistance value of the longest fanout line 111*a* is $R_1$ and a resistance value of the fanout line 111*b* covered by the additional conducting film is $R_2$, formulas for calculating the $R_1$ and $R_2$ are:

$$R_1 = \frac{R_s \cdot L_1}{W}, \text{ and } R_2 = \frac{R_s \cdot L_2}{W}$$

For the longest fanout line 111*a* without any additional conducting film, as shown in FIG. 3 and FIG. 5, the parasitic capacitor $C_1$ (namely $C_{LC}$) of the longest fanout line 111*a* is generated between the first conducting film 106 of the fanout line 111 and the ITO conducting film 201 of the color filter substrate 200, and between the second conducting film 104 of the fanout line 111 and the ITO conducting film 201 of the color filter substrate 200, where capacitance value of the parasitic capacitor $C_1$ is:

$$C_1 = \frac{\varepsilon_0 \cdot \varepsilon_{r1} \cdot L_1 \cdot W}{d_1}$$

where $\varepsilon_0$ is an absolute dielectric constant, $\varepsilon_{r1}$ is a relative dielectric constant of the liquid crystal layer of the LC panel, $L_1$ is a length of the fanout line 111*a*, W is a width of the fanout line 111*a*, and $d_1$ is the thickness of the liquid crystal layer. $L_1$ is calculated by a fanout tool (the fanout tool is a special tool for a designer). For the longest fanout line 111*a* without any additional conducting film, a formula for calculating time constant $\tau_1$ of the fanout line 111*a* is:

$$\tau_1 = R_1 \cdot C_1 = \frac{R_s \cdot \varepsilon_0 \cdot \varepsilon_{r1} \cdot L_1^2}{d_1}$$

The time constant $\tau_1$ and square of $L_1$ are directly proportional, a following result is obtained: the fanout line of two sides of entire fanout area is the longest, and the time constant $\tau_1$ of the longest fanout line is greatest. The time constant $\tau_1$ is regarded as a reference in the formula.

For the fanout line 111*b*, the length of the fanout line 111*b* without the ITO conducting film 101 is regarded as $L_{21}$, and the length of the fanout line 111*b* having the ITO conducting film 101 is regarded as $L_{22}$, relationship of the $L_{21}$ and the $L_{22}$ is:

$$L_2 = L_{21} + L_{22}$$

Capacitance value of the parasitic capacitor $C_{21}$ of the fanout line 111*b* without the ITO conducting film 101 is:

$$C_{21} = \frac{\varepsilon_0 \cdot \varepsilon_{r1} \cdot L_{21} \cdot W}{d_1}$$

Capacitance value of the additional capacitor $C_{22}$ of the fanout line 111b having the ITO conducting film 101 is:

$$C_{22} = \frac{\varepsilon_0 \cdot \varepsilon_{r2} \cdot L_{22} \cdot W}{d_2}$$

In the formula, $\varepsilon_{r2}$ is a relative dielectric constant of the first insulating layer 102 (namely passivation layer), and $d_2$ is the thickness of the first insulating layer 102. The relative dielectric constant of the passivation layer is close to the relative dielectric constant of the LC molecular layer. However, the thickness of the passivation layer is small, thus, in condition of same area, capacitance value of a new additional capacitor Cx is far greater than capacitance value of the parasitic capacitor $C_{LC}$ generated between the fanout line and the ITO conducting film of the color filter substrate. As shown in FIG. 5, in the first example, the capacitance value of the additional capacitor Cx is about ten times the capacitance value of the parasitic capacitor $C_{LC}$. The capacitor $C_{21}$ is connected with the capacitor $C_{22}$ in parallel. Capacitance value the capacitor $C_2$ of the entire fanout line 111b is:

$$C_2 = C_{21} + C_{22}$$

when adjusting impedance of the fanout line, the time constant of the fanout line 111a is regarded as the reference:

$$\tau_2 = R_2 \cdot C_2 = \tau_1$$

thus, formulas obtained according to the above-mentioned equation as follow:

$$L_{21} = \frac{\varepsilon_{r1} d_2 L_1^2 - \varepsilon_{r2} d_1 L_2^2}{L_2(d_2 \varepsilon_{r1} - d_1 \varepsilon_{r2})}$$

$$L_{22} = \frac{\varepsilon_{r1} d_2 (L_1^2 - L_2^2)}{L_2(d_1 \varepsilon_{r2} - d_2 \varepsilon_{r1})}$$

where $L_{22}$ is the length of the additional conducting film 101 that covers the fanout line 111b. Thus, area S of the ITO conducting film that covers the fanout line 111b is: $S = WL_{22}$.

An optimized structure of the first example is shown in FIG. 4. Straight-line distances between two endpoints of some of the fanout lines are different. Take the longest fanout line 111a and the fanout line 111b for example, the straight-line distance between two endpoints of the fanout line 111b is shorter than the straight-line distance between two endpoints of the longest fanout line 111a. Thus, in the first example, the fanout line 111b is configured with a bending section 112 to increase the length of the fanout line 111b. A waveform of the signal is affected by the resistance value R and the parasitic capacitor C of the fanout line, and a formula of the time constant τ of signal delay of the fanout line is: τ=RC. Namely, if the time constant τ of signal delay of each of the fanout lines is needed to be same, the resistance value R and the parasitic capacitor C of the fanout line can be simultaneously adjusted, which may meet requirement of the process, design, and production. In the fist example, the additional capacitor is generated through covering the fanout line with the additional conducting film on a basic of arranging the coiling in the fanout line, which reduces length of the coiling of the fanout line. If the resistance value and the time constant of the fanout line are far less than the resistance value and the time constant of the longest fanout line, the fanout line may be arranged the coiling and covered with the additional conducting film, which is suitable for a large size of the LCD television, thereby avoiding great height H of the fanout area because of more coilings and obtaining signal synchronization.

EXAMPLE 2

Figure 6:
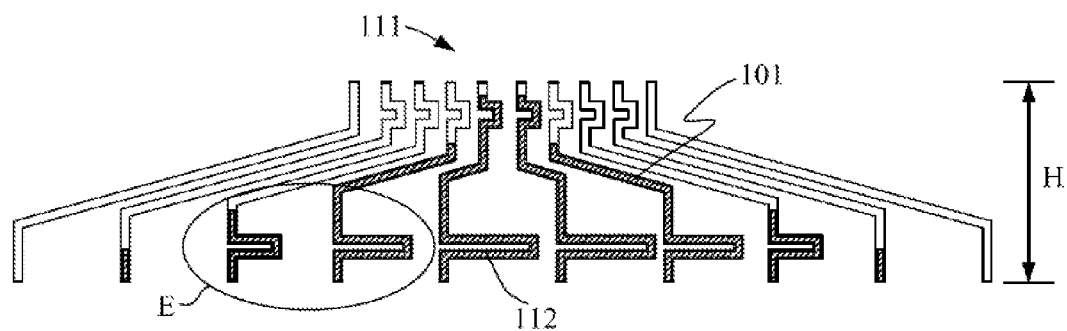
FIG. 6 is a schematic diagram of a fanout line of a second example of the present disclosure.
Figure 7:
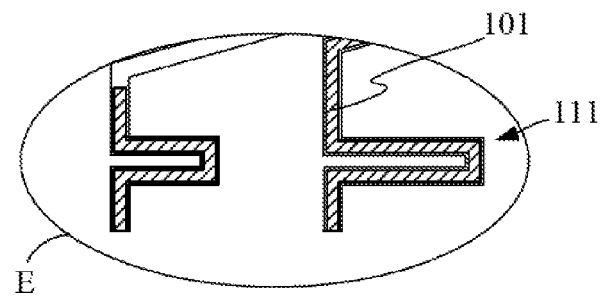
FIG. 7 is a local enlarged diagram of a fanout line of FIG. 4 taken from E.

As shown in FIG. 6 and FIG. 7, a difference between the first example and a second example as follows: the width of the additional conducting film is less than the width of the fanout line in the second example. In a condition that the width of the additional conducting film is less than the width of the fanout line, it should be considered that different width of the additional conducting film can be chosen according to a size of the panel and requirement of the process.

EXAMPLE 3

Figure 8:
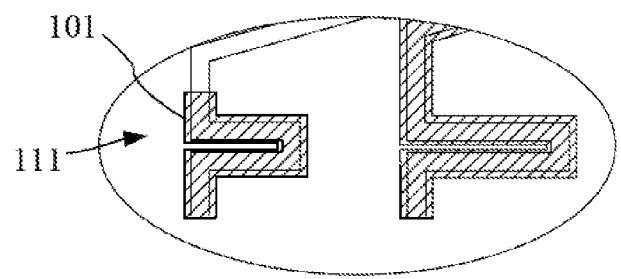
FIG. 8 is a structural diagram of a fanout line having an additional conducting film of a third example of the present disclosure.

FIG. 8 is a schematic diagram of a third example. The width of the additional conducting film 101 is greater than the width of the fanout line 111, which allows the width of the overlapping area between the additional conducting film 101 and the first conducting film is a same as the width of the first conducting film, thereby improving accuracy of calculating the additional capacitor.

EXAMPLE 4

Figure 9:
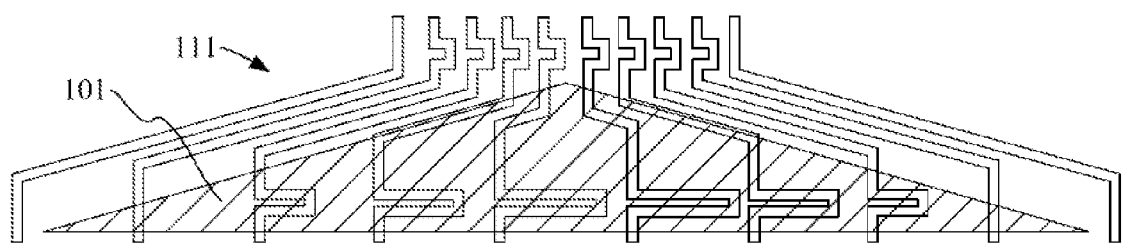
FIG. 9 is a structural diagram of a fanout line having an additional conducting film of a fourth example of the present disclosure.

As shown in FIG. 9, a fourth example is difference from the above-mentioned examples, in the fourth example, a block of additional conducting film 101 covers a plurality of fanout lines to obtain the additional capacitor, which simplifies manufacturing process without any complicated covering film, thereby reducing cost.

EXAMPLE 5

Figure 10:
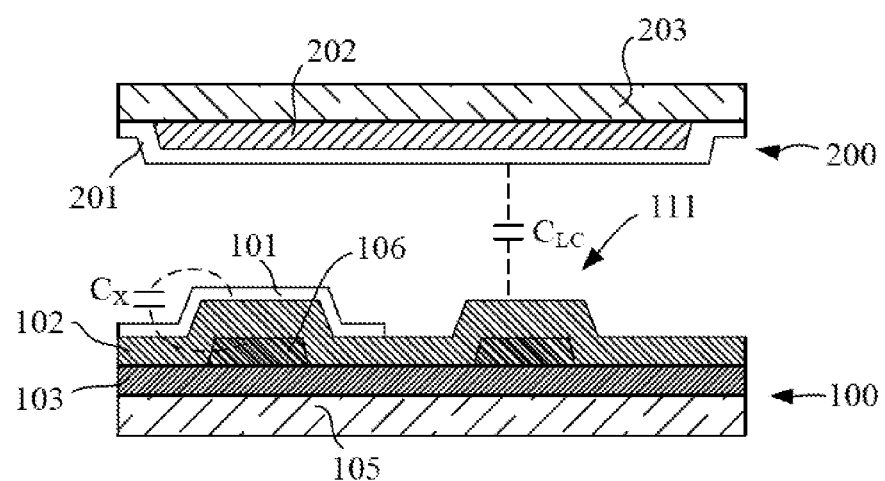
FIG. 10 is a sectional view of a fanout line of a fifth example of the present disclosure.

As shown in FIG. 10, a difference between the first example and a fifth example as follows: besides the additional conducting film, only one conducting film is arranged in the fanout line. Namely, the fanout line 111 only is configured with the first conducting film 106, where the first conducting film 106 is the metal conducting film. The insulating medium of the additional capacitor Cx is the first insulating film 102, where the first insulating film 102 is the passivation layer PAV, which simplifies manufacturing process. However, stability of the fifth example is lower than the first example.

EXAMPLE 6

Figure 11:
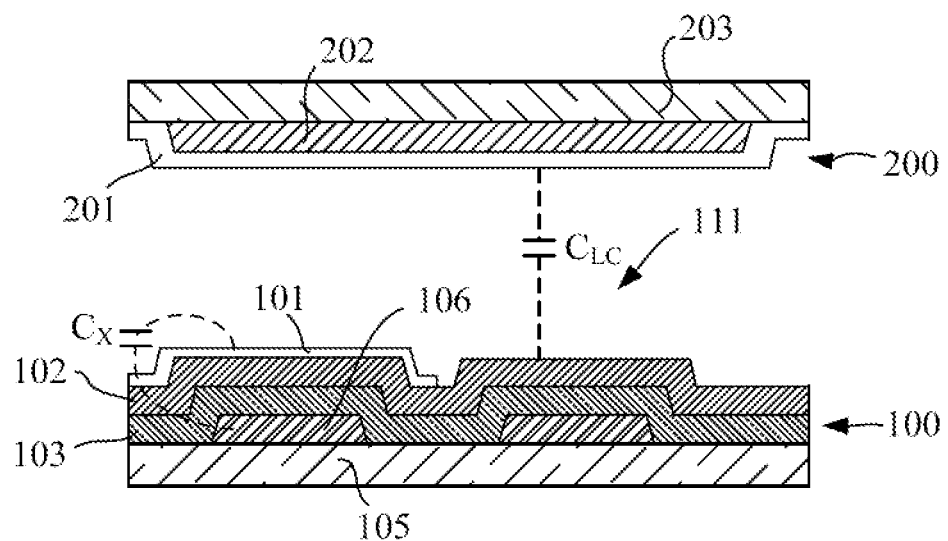
FIG. 11 is a sectional view of a fanout line of a sixth example of the present disclosure.

As shown in FIG. 11, in a sixth example, one conducting film is arranged in the fanout line. A difference between the fifth example and the sixth example as follows: the insulating medium of the additional capacitor Cx is the first insulating film 102 and the second insulating film 102, namely the passivation layer and the gate insulating film.

EXAMPLE 7

Figure 12:
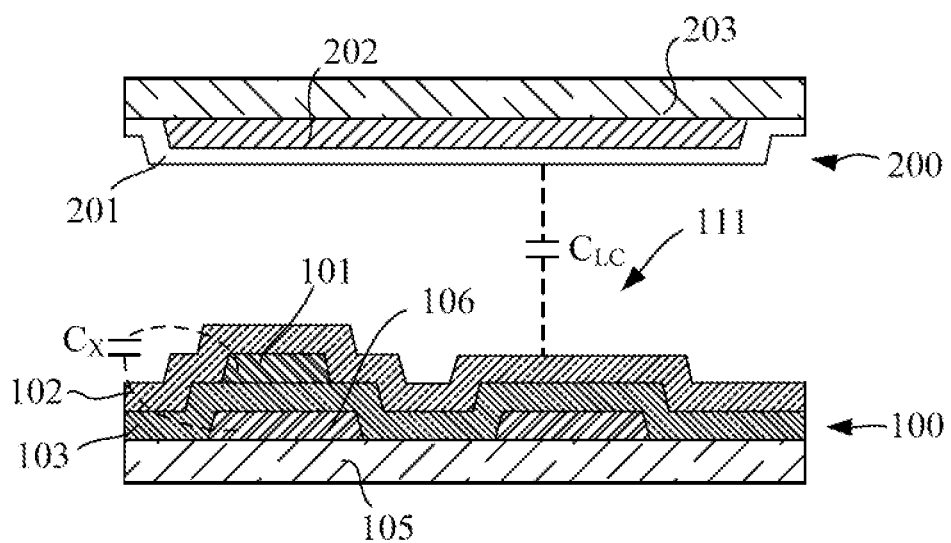
FIG. 12 is a sectional view of a fanout line of a seventh example of the present disclosure.

As shown in FIG. 12, in a seventh example, one conducting film is arranged in the fanout line. A difference between the seventh example and the above-mentioned examples as follows: the additional conducting film 101 is the metal conducting film, the first insulating film 102 is arranged on the additional conducting film 101, which protects the additional conducting film 101. The insulating medium between the first conducting film 106 and the additional conducting film 101 is the second insulating film 103 (namely the gate insulating film).

The present disclosure is described in detail in accordance with the above contents with the specific exemplary examples. However, this present disclosure is not limited to the specific examples. For the ordinary technical personnel of the technical field of the present disclosure, on the premise of keeping the conception of the present disclosure, the technical personnel can also make simple deductions or replacements, and all of which should be considered to belong to the protection scope of the present disclosure.

I claim:

1. A fanout line structure of an array substrate, comprising:
   a plurality of fallout lines arranged on a fanout area of the array substrate;
   wherein resistance value of the fanout line is dependent on length of the fanout line;
   each of the fanout lines comprises a first conducting film; resistance values of a first part of fanout lines are less than resistance values of a second part of the fanout lines, and the first part of the fanout lines are covered by an additional conducting film; in the fanout lines covered by the additional conducting film, as the resistance value of the fanout line increases, area of the additional conducting film covering the fanout line correspondingly decreases; an additional capacitor is generated between the additional conducting film and the first conducting film, wherein a width of the additional conducting film of each of the fanout lines is a same as a width of an overlapping area between the first conducting film and the additional conducting film of each of the fanout lines, and lengths of the additional conducting films that cover the fanout lines having different resistance values are different, wherein the length of the additional conducting film that covers the fanout line is $L_{22}$:

$$L_{22} = \epsilon_{r1} d_2 (L_1^2 - L_2^2) / L_2 (d_1 \epsilon_{r2} - d_2 \epsilon_{r1});$$

wherein $L_1$ is a length of one of the plurality of fanout lines, and a fanout line having a length L1 is regarded as a reference line: $L_2$ is a length of the fanout line covered by the additional conducting film, $L_{22}$ is the length of the additional conducting film covering the fanout line having a length $L_2$, $\epsilon_{r1}$ is a relative dielectric constant of a liquid crystal layer of a liquid crystal panel, $d_1$ is thickness of the liquid crystal layer, $\epsilon_{r2}$ is a relative dielectric constant of a dielectric medium between the additional conducting film and the first conducting film, and $d_2$ is a thickness of the dielectric medium between the additional conducting film and the first conducting film.

2. The fanout line structure of the array substrate of claim 1, wherein the reference line is a longest fanout line of all of the fanout lines.

3. The fanout line structure of the array substrate of claim 1, wherein a dielectric medium between the additional conducting film and the first conducting film is a passivation layer.

4. The fanout line structure of the array substrate of claim 1, wherein straight-line distances between two endpoints of some of the fanout lines are different; in the fallout lines having a short straight-line distance, at least one fanout line is configured with a bending section.

5. The fanout line structure of the array substrate of claim 1, wherein the first conducting film is a metal conducting film.

6. The fanout line structure of the array substrate of claim 1, wherein the additional conducting film is an indium tin oxide conducting film or a metal conducting film.

7. The fanout line structure of the array substrate of claim 1, further comprising a second conducting film arranged under the first conducting film.

8. The fanout line structure of the array substrate of claim 1, wherein a block of additional conducting film covers the plurality of fanout lines.

9. A display panel, comprising:
   a plurality of fallout lines arranged on a fanout area of the array substrate;
   wherein resistance value of the fanout line is dependent on length of the fanout line;
   each of the fanout lines comprises a first conducting film; resistance values of a first part of fanout lines are less than resistance values of a second part of the fanout lines, and the first part of the fanout lines are covered by an additional conducting film; in the fanout lines covered by the additional conducting film, as the resistance value of the fanout line increases, area of the additional conducting film covering the fanout line correspondingly decreases; an additional capacitor is generated between the additional conducting film and the first conducting film, wherein a width of the additional conducting film of each of the fanout lines is a same as a width of an overlapping area between the first conducting film and the additional conducting film of each of the fanout and lengths of the additional conducting film that cover the fanout lines having different resistance values are different, wherein the length of the additional conducting film that covers the fanout lines is $L_{22}$:

$$L_{22} = \epsilon_{r1} d_2 (L_1^2 - L_2^2) / L_2 (d_1 \epsilon_{r2} - d_2 \epsilon_{r1});$$

wherein is $L_1$ length of one of the plurality of the fanout lines, and a fanout line having a length L1 is regarded as a reference line; $L_2$ is a length of the fanout line covered by the additional conducting film, $L_{22}$ is the length of the additional conducting film covering the fanout line having a length $L_2$, $\epsilon_{r1}$ is a relative dielectric constant of a liquid crystal layer of a liquid crystal panel, $d_1$ is thickness of the liquid crystal layer, $\epsilon_{r2}$ is a relative dielectric constant of a dielectric medium between the additional conducting film and the first conducting film, and $d_2$ is a thickness of the dielectric medium between the additional conducting film and the first conducting film.

10. The display panel of claim 9, wherein the reference line is a longest fanout line of all of the fanout lines.

11. The display panel of claim 9, wherein a dielectric medium between the additional conducting film and the first conducting film is a passivation layer.

12. The display panel of claim 9, wherein straight-line distances between two endpoints of some of the fallout lines are different; in the fallout lines having a short straight-line distance, at least one fallout line is configured with a bending section.

13. The display panel of claim 9, wherein the first conducting film is a metal conducting film.

14. The display panel of claim 9, wherein the additional conducting film is an indium tin oxide conducting film of a metal conducting film.

15. The display panel of claim 9, wherein a block of additional conducting film covers the plurality of the fanout lines.

* * * * *